US011848804B2

(12) United States Patent
Kobayashi

(10) Patent No.: US 11,848,804 B2
(45) Date of Patent: *Dec. 19, 2023

(54) ELECTROMAGNETIC WAVE TRANSMISSION APPARATUS AND ELECTROMAGNETIC WAVE COMMUNICATION SYSTEM

(71) Applicant: PIONEER CORPORATION, Tokyo (JP)

(72) Inventor: Hideki Kobayashi, Kawagoe (JP)

(73) Assignee: PIONEER CORPORATION, Tokyo (JP)

(*) Notice: Subject to any disclaimer, the term of this patent is extended or adjusted under 35 U.S.C. 154(b) by 277 days.

This patent is subject to a terminal disclaimer.

(21) Appl. No.: 17/420,972

(22) PCT Filed: Jan. 6, 2020

(86) PCT No.: PCT/JP2020/000048
§ 371 (c)(1),
(2) Date: Jul. 6, 2021

(87) PCT Pub. No.: WO2020/145235
PCT Pub. Date: Jul. 16, 2020

(65) Prior Publication Data
US 2022/0103406 A1 Mar. 31, 2022

(30) Foreign Application Priority Data
Jan. 9, 2019 (JP) .................. 2019-001972

(51) Int. Cl.
*H04L 27/04* (2006.01)
*H03B 7/06* (2006.01)
*H04B 1/04* (2006.01)

(52) U.S. Cl.
CPC .............. *H04L 27/04* (2013.01); *H03B 7/06* (2013.01); *H04B 1/04* (2013.01)

(58) Field of Classification Search
CPC .. H04L 27/04; H03B 7/06; H03B 7/08; H04B 1/04; H03C 7/00
See application file for complete search history.

(56) References Cited

U.S. PATENT DOCUMENTS 11,018,908 B2 * 5/2021 Stojanovic ........... H04B 10/695
2020/0111929 A1 * 4/2020 Koyama .............. H01Q 9/0407

FOREIGN PATENT DOCUMENTS

| JP | 2010041204 A | 2/2010 |
|---|---|---|
| JP | 2011182218 A | 9/2011 |
| JP | 2012191520 A | 10/2012 |

OTHER PUBLICATIONS

Notice of Reasons for Refusal for related Application No. JP 2020-565143, dated Apr. 19, 2022, 1 page.
(Continued)

*Primary Examiner* — Siu M Lee
(74) *Attorney, Agent, or Firm* — Procopio, Cory, Hargreaves & Savitch LLP

(57) ABSTRACT

An electromagnetic wave transmission apparatus of the present invention includes a transmission unit whose voltage-current characteristics have a local maximum value and a local minimum value located on a higher voltage side than the local maximum value and which transmits an electromagnetic wave indicating a modulation signal, an acquisition unit which acquires a digital signal, and a modulation unit which modulates the digital signal into the modulation signal which is a signal using voltage values of three levels or more in an oscillation region which is a voltage region that is equal to or more than a voltage of the local maximum voltage and equal to or less than a voltage of the local minimum voltage. The transmission unit preferably transmits a synchronization signal as at least a part of the modulation signal. In this case, the synchronization signal preferably includes a maximum value and a minimum value (Continued)

among the voltage values of three levels or more, and includes a pattern in which the voltage value transitions from one of the maximum value and the minimum value to the other.

6 Claims, 4 Drawing Sheets

(56) References Cited

OTHER PUBLICATIONS

Diebold, S. et al., "Modulation Schemes for Resonant Tunneling Diodes to Enhance the Data-Rate of Wireless Communications", (2016) 41st International Conference on Infrared, Millimeter, and Terahertz waves.

Wang, Jue et al., "15 Gbps Wireless Link Using W-band Resonant Tunnelling Diode Transmitter", (2018) 15th European Radar Conference.

Sugiyama Hiroki et al., "Realization of Resonant-Tunneling-Diode Terahertz Oscillators by High Precision Semiconductor Crystal Growth Control Technology", NTT Technical Journal, Jul. 2011.

International Search Report dated Feb. 10, 2020, from International Application No. PCT/JP2020/000048, 2 pages.

Oshima Naoto et al: "Terahertz Wireless Data Transmission With Frequency and Polarization Division Multiplexing Using Resonant-Tunneling-Diode Oscillators", IEEE Transactions on Terahertz Science and Technology, IEEE, Piscataway, NJ, USA, vol. 7, No. 5, Sep. 30, 2017 (Sep. 30, 2017), pp. 593-598, XP011660228, ISSN: 2156-342X, DOI: 10.1109/TTHZ.2017.2720470 [retrieved on Sep. 12, 2017] * p. 594, col. 1, paragraph 1; figure 3 *.

Takao Waho et al: "Resonant-Tunneling Diode and HEMT Logic Circuits with Multiple Thresholds and Multilevel Output", IEEE Journal of Solid-State Circuits, IEEE, USA, vol. 33, No. 2, Feb. 28, 1998 (Feb. 28, 1998), XP011060676, ISSN: 0018-9200 * Title; the whole document*.

Extended European Search Report in European Application No. 20739078.2, dated Aug. 22, 2022, in 7 pages.

* cited by examiner

ELECTROMAGNETIC WAVE TRANSMISSION APPARATUS AND ELECTROMAGNETIC WAVE COMMUNICATION SYSTEM

CROSS-REFERENCE TO RELATED APPLICATIONS

This application is a U.S. National Stage entry of PCT Application No: PCT/JP2020/000048 filed Jan. 6, 2020, which claims priority to Japanese Patent Application No. 2019-001972 filed Jan. 9, 2019, the contents of which are incorporated herein by reference.

TECHNICAL FIELD

The present invention relates to an electromagnetic wave transmission apparatus and an electromagnetic wave communication system.

BACKGROUND ART

As a modulation method for communication used for an oscillating element for electromagnetic wave transmission, an amplitude-shift keying modulation method (hereinafter referred to as ASK modulation method) is known. In addition, as a modulation method for communication, an on-off keying modulation method (hereinafter referred to as an OOK modulation method) is also known as one method included in the ASK modulation method.

Here, Patent Document 1 discloses a technique related to the ASK modulation method using a resonant tunneling diode (hereinafter referred to as RTD) as an oscillating element for electromagnetic wave transmission. Specifically, the technique is a technique that represents a binary value by switching between data in an oscillation region of the RTD (for example, a signal corresponding to On) and data in a non-oscillation region (for example, a signal corresponding to Off), that is, a technique for representing On and Off by a difference in amplitude.

In addition, Patent Document 2 discloses a technique related to an ASK modulation method using a terahertz wave of continuous oscillation such as RID. Specifically, the technique is a technique in which variable light having variable intensity is superimposed and incident on a modulation element as signal light, and the amplitude of the terahertz wave is modulated according to the signal intensity.

RELATED DOCUMENT

Patent Document

[Patent Document 1] Japanese Unexamined Patent Publication No. 2012-191520
[Patent Document 2] Japanese Unexamined Patent Publication No. 2010-41204

SUMMARY OF THE INVENTION

Technical Problem

However, since the techniques disclosed in Patent Document 1 and Patent Document 2 are techniques that represent a binary value due to differences in amplitude, there is a limit to increasing the transmission speed (or communication speed).

As an example of the problem to be solved by the present invention, increasing the transmission speed can be included.

Solution to Problem

The invention according to claim 1 is an electromagnetic wave transmission apparatus including a transmission unit whose voltage-current characteristics have a local maximum value and a local minimum value located on a higher voltage side than the local maximum value and which transmits an electromagnetic wave indicating a modulation signal, an acquisition unit which acquires a digital signal, and a modulation unit which modulates the digital signal into the modulation signal which is a signal using voltage values of three levels or more in an oscillation region which is a voltage region that is equal to or more than a voltage of the local maximum value and equal to or less than a voltage of the local minimum value.

BRIEF DESCRIPTION OF THE DRAWINGS

The above-described objectives and other objectives, features, and advantages will be further clarified by the preferred embodiments described below and the accompanying drawings below.

DESCRIPTION OF EMBODIMENTS

<Overview>

Figure 1:
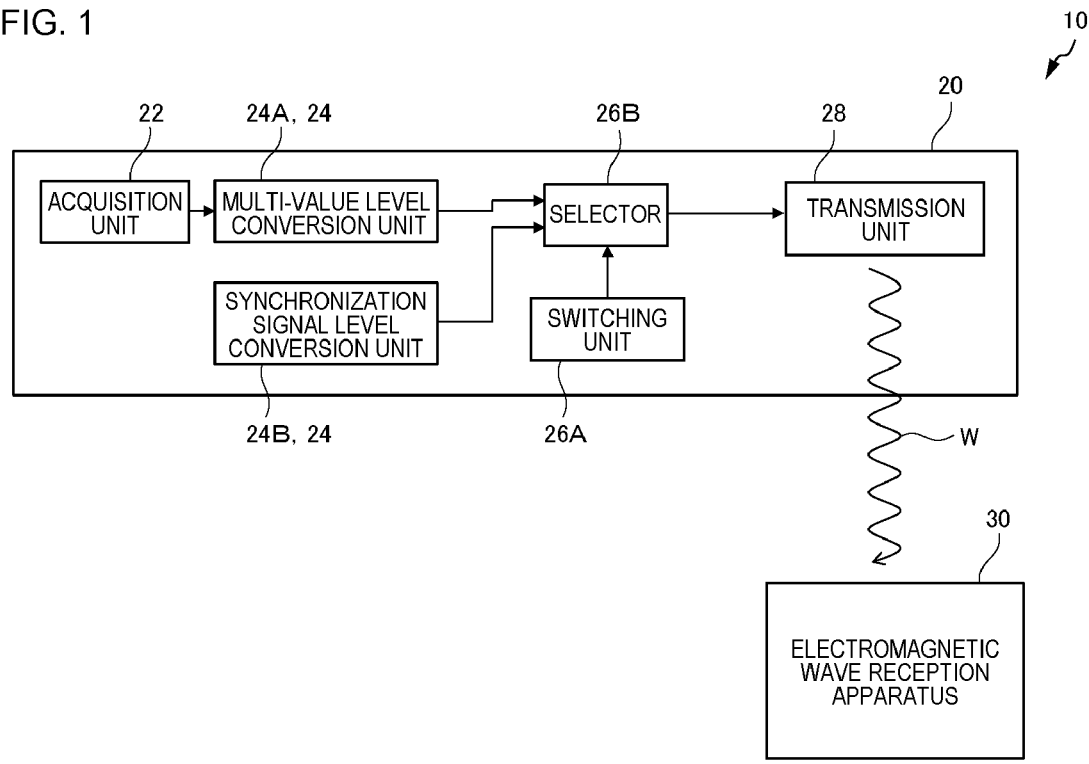
FIG. 1 is a schematic view of an electromagnetic wave communication system of the present embodiment.

Hereinafter, the present embodiment (an example of the present invention) will be described. First, functions and configurations of an electromagnetic wave communication system 10 (refer to FIG. 1) of the present embodiment will be described with reference to the drawings. Next, operation of the electromagnetic wave communication system 10 of the present embodiment will be described with reference to the drawings. The effect of the present embodiment will be described in the description of the operation. In all the drawings to be referred to, components having the same function are designated by the same reference numerals, and the description thereof will not be repeated.

<Configuration>

FIG. 1 is a schematic view of an electromagnetic wave communication system 10 of the present embodiment. The electromagnetic wave communication system 10 includes an electromagnetic wave transmission apparatus 20 and an electromagnetic wave reception apparatus 30. The electromagnetic wave communication system 10 has a function of receiving an electromagnetic wave W transmitted by the electromagnetic wave transmission apparatus 20 by the electromagnetic wave reception apparatus 30.

The electromagnetic wave W of the present embodiment is an electromagnetic wave indicating a modulation signal described later. In addition, the electromagnetic wave W of the present embodiment is a terahertz wave as an example. Here, the terahertz wave is referred to as an electromagnetic wave having a shorter wavelength than millimeter waves and a longer wavelength than infrared rays. The terahertz wave is an electromagnetic wave having both properties of an optical wave and a radio wave, and has, for example, a property of transmitting (or easily transmitting) cloth, paper, wood, plastic, ceramics, or the like, and not transmitting (or hardly transmitting) metal, water, or the like. Generally, the frequency of the terahertz wave is also referred to as an electromagnetic wave of around 1 THz (wavelength corresponds to around 300 μm), but there is generally no clear definition of the range. Therefore, in the present specification, the wavelength range of the terahertz wave is defined as a range of 70 GHz or more and 10 THz or less.

[Electromagnetic Wave Transmission Apparatus]

Figure 2:
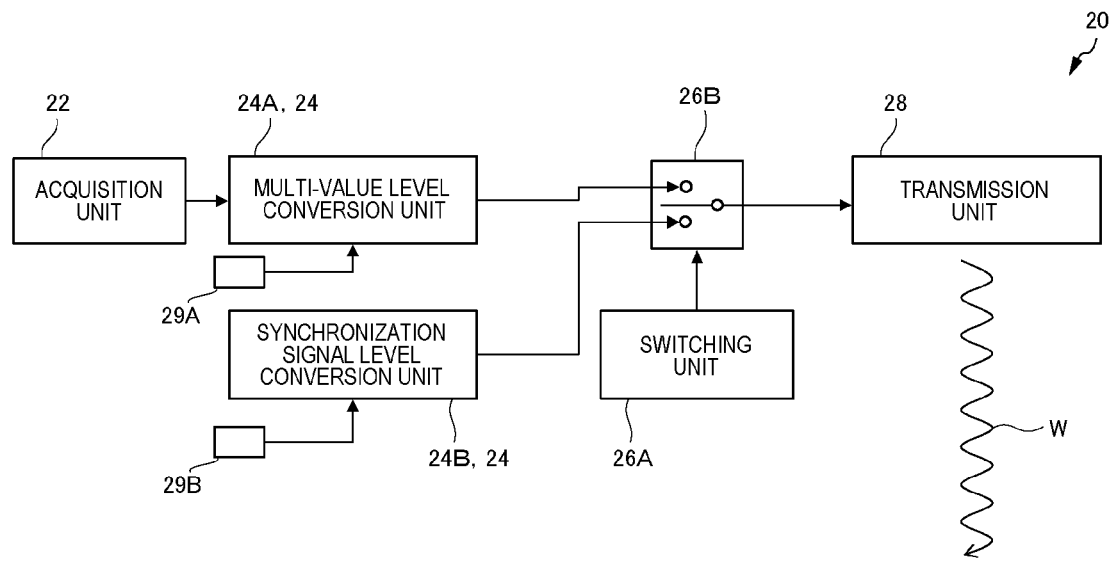
FIG. 2 is a schematic view of an electromagnetic wave transmission apparatus included in an electromagnetic wave communication system of the present embodiment.

FIG. 2 is a schematic view of an electromagnetic wave transmission apparatus 20 of the present embodiment. The electromagnetic wave transmission apparatus 20 has a function of transmitting the electromagnetic wave W indicating a modulation signal that is subjected to multi-value modulation. The electromagnetic wave transmission apparatus 20 includes, as an example, an acquisition unit 22, a conversion unit 24 (an example of a modulation unit), a switching unit 26A, a selector 26B, a transmission unit 28, a multi-value level setting unit 29A, and a synchronization level setting unit 29B.

(Acquisition Unit) The acquisition unit 22 of the present embodiment has a function of acquiring digital signals such as sound and video as an example. In addition, the acquisition unit 22 has a function of outputting the acquired digital signal to the conversion unit 24.

(Conversion Unit) As an example, the conversion unit 24 of the present embodiment includes the multi-value level conversion unit 24A and the synchronization signal level conversion unit 24B.

The multi-value level conversion unit 24A has a function of receiving a digital signal (data for communication) from the acquisition unit 22, converting the digital signal into a multi-value level signal according to the multi-value level setting, and outputting the signal. Here, the multi-value level setting means setting a voltage level of three levels or more in an oscillation region RA (refer to FIG. 3) described later.

In addition, the synchronization signal level conversion unit 24B has a function of outputting a predetermined synchronization signal level according to the synchronization level setting. Here, the synchronization level setting means setting a voltage level of three levels or more in an oscillation region RA (refer to FIG. 3).

(Switching Unit and Selection Unit)

The switching unit 26A has a function of generating a switching timing of data selected by the selector 26B and output to the transmission unit 28 and inputting the data to the selector 26B. Here, the data are data (hereinafter referred to as multi-value data) output by the multi-value level conversion unit 24A and data (hereinafter referred to as synchronization signal data) output by the synchronization signal level conversion unit 24B.

The selector 26B has a function of outputting the synchronization signal data and the multi-value data to the transmission unit 28 at different timings according to the switching timing of the data generated by the switching unit 26A.

(Transmission Unit)

The transmission unit 28 has a function of oscillating the data selected and input by the selector 26B as an electromagnetic wave W (in the case of this embodiment, the terahertz wave as described above). Therefore, the transmission unit 28 has an element that oscillates the terahertz wave. The element that oscillates the terahertz wave of the present embodiment is an RTD as an example. However, the element does not have to be an RTD as long as it is an element that oscillates the terahertz wave.

Figure 3:
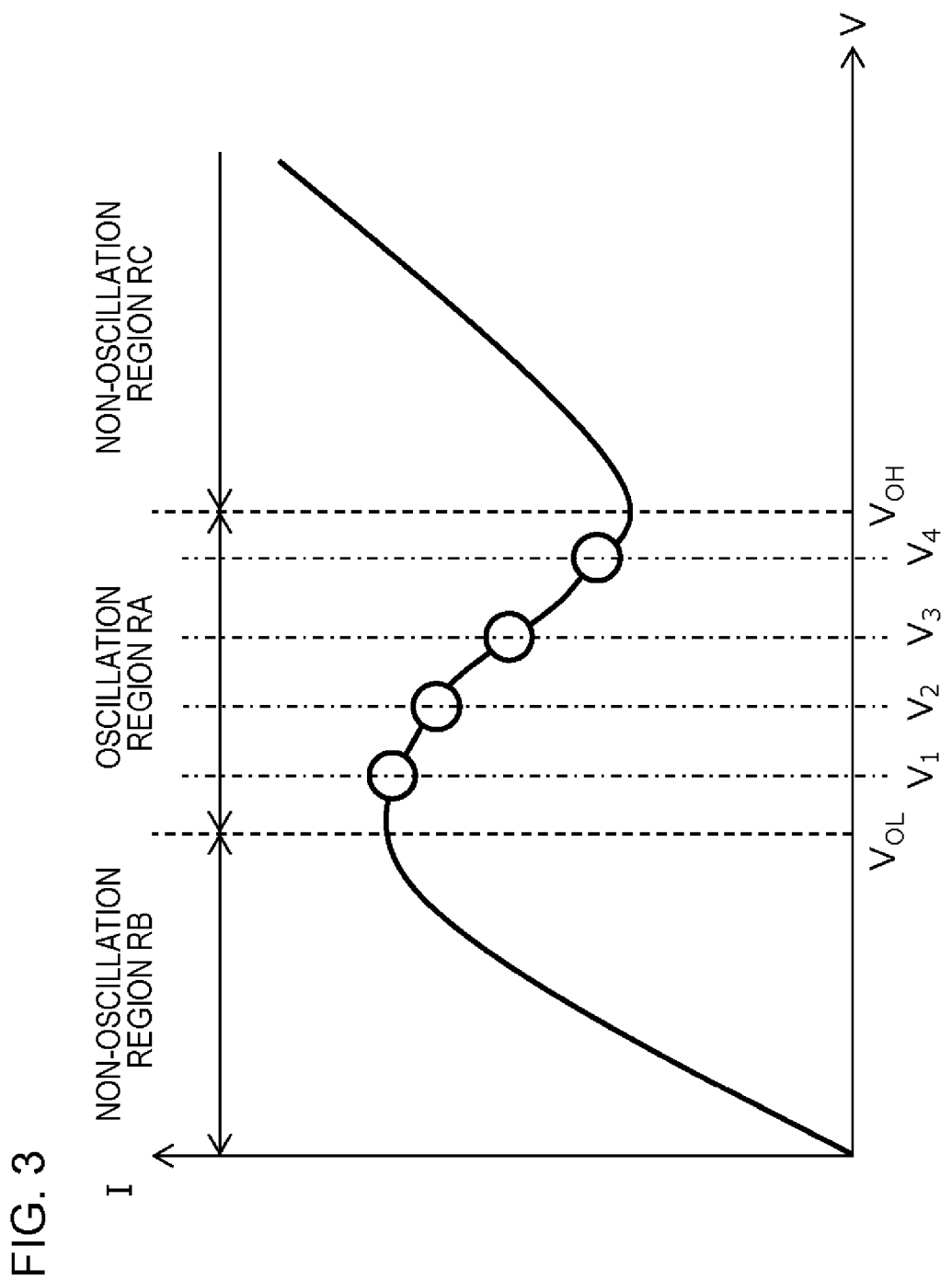
FIG. 3 is a graph showing voltage-current characteristics of an element for oscillating an electromagnetic wave included in an electromagnetic wave transmission apparatus of the present embodiment and voltage values of four levels in an oscillation region.

Here, the voltage-current characteristics of RTD (characteristics of current with respect to voltage in a two-dimensional graph showing a relationship between voltage and current) will be described with reference to the graph of FIG. 3. FIG. 3 is a graph showing voltage-current characteristics of RTD of the present embodiment and voltage values of four levels in an oscillation region RA.

The RTD has the local maximum value and the local minimum value located on the higher voltage side than the local maximum value in the voltage-current characteristics. Here, the voltage value at the local maximum value is defined as a voltage value $V_{OL}$, and the voltage value at the local minimum value is defined as a voltage value $V_{OH}$. A spectrum of a current from the voltage value $V_{OL}$ to the voltage value $V_{OH}$ is a differential negative resistance region showing differential negative resistance characteristics. In the present specification, the differential negative resistance region is defined as the oscillation region RA. That is, the RTD has a differential negative resistance region (oscillation region RA) showing the differential negative resistance characteristics in the voltage-current characteristics of an operating region. Then, the RTD functions as the element that oscillates the electromagnetic wave W when the voltage value in the oscillation region RA is applied. Both sides of the oscillation region RA in the graph of voltage-current characteristics correspond to the non-oscillation region of the RTD. Here, the non-oscillation region of the RTD means a region other than the voltage region for oscillating the electromagnetic wave W in the voltage-current characteristics of the RTD. In the present specification, a region on the lower voltage side than the voltage value $V_{OL}$ among the non-oscillation regions is defined as a non-oscillation region RB, and a region on the higher voltage side than the voltage value $V_{OH}$ is defined as a non-oscillation region RC.

Then, when the synchronization signal data from the synchronization signal level conversion unit 24B is input, the transmission unit 28 transmits a synchronization signal having the pattern corresponding to the voltage values of three levels or more in the oscillation region RA. Here, the synchronization signal of the present embodiment is a signal for informing the electromagnetic wave reception apparatus 30 of a detection timing of the transmission signal, and also has a role of causing the electromagnetic wave reception apparatus 30 to recognize a part or all of the voltage levels used for the modulation signal. Next, when the multi-value data from the multi-value level conversion unit 24A is input, the transmission unit 28 transmits a digital signal having the pattern corresponding to the voltage values of three levels or more in the oscillation region RA. Here, the voltage values of three levels or more in the present embodiment are voltage values of four levels as an example.

As described above, the multi-value level setting and the synchronization level setting in the present embodiment are set to the voltage values of four levels in the oscillation region RA. In addition, the electromagnetic wave transmission apparatus 20 of the present embodiment performs multi-value modulation on the multi-value data and the synchronization signal data, and transmits data subjected to the multi-value modulation to the electromagnetic wave reception apparatus 30 on the electromagnetic wave W.

[Electromagnetic Wave Reception Apparatus]

The electromagnetic wave reception apparatus 30 receives the electromagnetic wave W transmitted by the electromagnetic wave transmission apparatus 20 and demodulates the received electromagnetic wave W into a digital signal. For example, in a case where the digital signal is a signal obtained by digitizing sound, the electromagnetic wave reception apparatus 30 generates a detection timing based on the synchronization signal data among the electromagnetic waves W received by the electromagnetic wave reception apparatus 30, and demodulates the digital signal of the sound.

The above is the description of the configuration of the present embodiment.

<Operation>

Next, operation of the electromagnetic wave communication system 10 of the present embodiment will be described with reference to the drawings. Hereinafter, the overall flow will be described first, and then a specific example of multi-value modulation will be described. As an example, the electromagnetic wave communication system 10 is used to communicate signals related to sound. In addition, as described above, the effects of the present embodiment will be described together with the following description.

[Overall Flow]

Hereinafter, the overall flow of the operation of the present embodiment will be described with reference to FIGS. 1 and 2.

First, the acquisition unit 22 acquires a digital signal related to sound from an external apparatus (not shown in the drawings), and outputs the acquired digital signal to the conversion unit 24 (multi-value level conversion unit 24A).

Next, the multi-value level conversion unit 24A receives the digital signal (data for communication) from the acquisition unit 22, converts it to the multi-value level according to the multi-value level setting by the multi-value level setting unit 29A, and outputs it. In addition, the synchronization signal level conversion unit 24B outputs a predetermined synchronization signal level according to the synchronization level setting by the synchronization level setting unit 29B.

Next, the switching unit 26A generates a switching timing between the multi-value data and the synchronization signal data that are selected by the selector 26B and are output to the transmission unit 28, and inputs the switching timing to the selector 26B. As a result, the selector 26B outputs the synchronization signal data and the multi-value data to the transmission unit 28 at different timings according to the switching timing generated by the switching unit 26A.

Next, the transmission unit 28 transmits the data selected and input by the selector 26B on the electromagnetic wave W. That is, the transmission unit 28 transmits the electromagnetic wave W indicating a modulation signal for the data.

Next, the electromagnetic wave reception apparatus 30 receives the electromagnetic wave W transmitted by the transmission unit 28 (electromagnetic wave transmission apparatus 20), generates a detection timing based on the synchronization signal data among the received electromagnetic waves W, and demodulates the multi-value data into the digital signal. As a result, the electromagnetic wave W received by the electromagnetic wave reception apparatus 30 is demodulated into the digital signal of the sound.

The above is the description of the overall flow of the operation of the present embodiment.

[Specific Example of Multi-Value Modulation]

Next, a specific example of the modulation signal will be described with reference to FIGS. 3, 4, and 5. Each of FIGS. 4 and 5 is an example of a modulation signal transmitted by the electromagnetic wave transmission apparatus 20 of the present embodiment.

Figure 4:
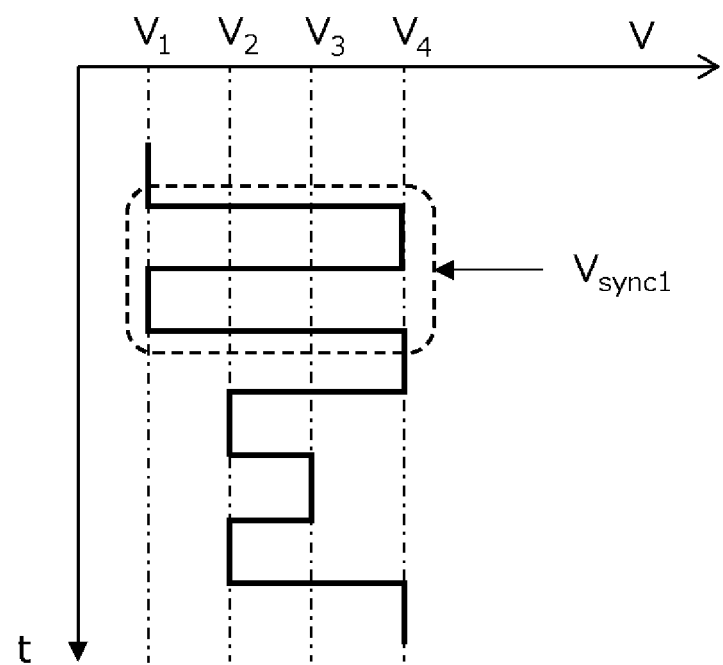
FIG. 4 is an example of a modulation signal transmitted by the electromagnetic wave transmission apparatus of the present embodiment.
Figure 5:
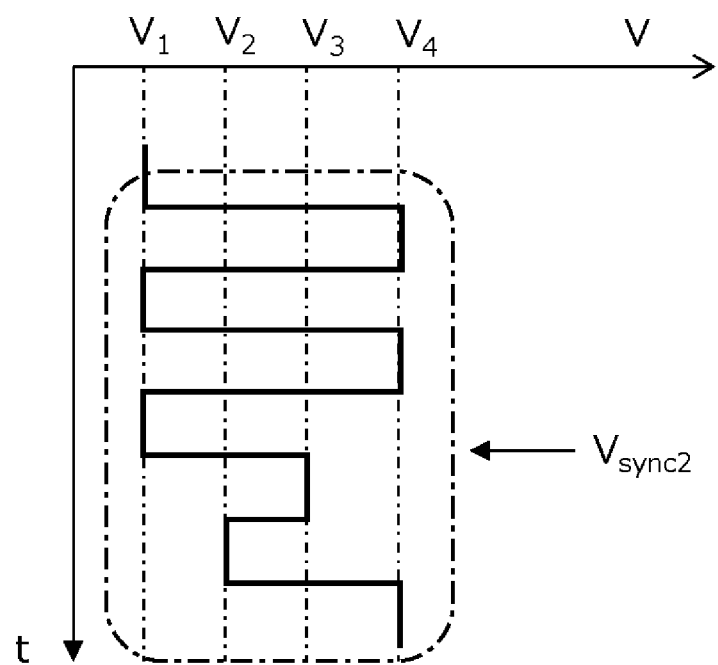
FIG. 5 is another example of a modulation signal transmitted by the electromagnetic wave transmission apparatus of the present embodiment.

Here, in FIGS. 4 and 5, V shows a voltage value and t indicates a time. Each of $V_1$, $V_2$, $V_3$, and $V_4$ on the axis of the voltage value V shows the voltage values of four levels in the oscillation region RA. Then, FIGS. 4 and 5 show examples of patterns of the modulation signal input to the transmission unit 28 through the selector 26B. The pattern of the modulation signal has the multi-value data and the synchronization signal data.

$V_{sync1}$ in FIG. 4 shows a portion corresponding to the synchronization signal data among the modulation signals. In addition, $V_{sync2}$ in FIG. 5 is a case of the synchronization signal data using four levels which are all levels as the multi-value level which can be taken by the digital signal.

As shown in FIGS. 4 and 5, the signal generated by the conversion unit 24 of the present embodiment is a modulation signal using the voltage values of four levels $V_1$, $V_2$, $V_3$, and $V_4$ in the oscillation region RA. That is, the signal generated by the conversion unit 24 of the present embodiment is a modulation signal that is subjected to the multi-value modulation using the voltage values of three levels or more in the oscillation region RA. Specifically, the modulation signal is a signal subjected to the multi-value modulation by converting, for example, data of m-bit (m≥1, and in the case of the present embodiment, m=2 as an example) into a voltage level (in the case of the present embodiment, voltage values $V_1$, $V_2$, $V_3$, and $V_4$) of an n-value (n≥3, and in the case of the present embodiment, n=4). Therefore, in the case of the present embodiment, the amount of data that can be transmitted in the same time is larger than that of the techniques disclosed in the above-described Patent Documents 1 and 2 (hereinafter, referred to as comparative techniques).

Accordingly, the electromagnetic wave transmission apparatus 20 of the present embodiment can increase the transmission speed as compared with the comparative techniques. As a result, in the electromagnetic wave communication system 10 of the present embodiment, the communication speed can be increased as compared with the comparative techniques.

In addition, as shown in FIG. 4, a partial $V_{sync1}$ corresponding to the synchronization signal data includes the voltage value $V_4$ as the maximum voltage setting level and the voltage value $V_1$ as the minimum voltage setting level in the oscillation region RA. Therefore, the synchronization signal is generated using the voltage value in the oscillation region RA.

Therefore, in the case of the present embodiment, the width of the voltage transition can be narrowed as compared with a case where the synchronization signal and the digital signal include voltage values of the non-oscillation regions RB and RC as in the comparative techniques. Accordingly, in the case of the present embodiment, a dynamic range of a generation circuit (not shown in the drawings) included in the multi-value level conversion unit 24A and the synchronization signal level conversion unit 24B can be reduced as compared with the comparative techniques. That is, in the case of the present embodiment, the transition time of the voltage value can be shortened as compared with the comparative techniques.

As shown in FIG. 5, by using $V_{sync2}$ using all the multi-value levels that the digital signal can take as the synchronization signal data as the synchronization signal data, it is possible to transmit the level voltage of the synchronization signal as teaching data to the electromagnetic wave reception apparatus 30. In the electromagnetic wave reception apparatus 30, it is possible to extract each level voltage from the received synchronization signal and set the level of the multi-value data of the received signal.

In addition, as shown in FIG. 4, the partial $V_{sync1}$ corresponding to the synchronization signal data includes the voltage value $V_4$ as the maximum voltage setting level and the voltage value $V_1$ as the minimum voltage setting level. That is, the synchronization signal of the present embodiment has a pattern including the maximum voltage value (voltage value $V_4$) and the minimum voltage value (voltage value $V_1$) among the voltage setting levels in the oscillation region RA. Therefore, the electromagnetic wave reception apparatus 30 of the present embodiment recognizes the maximum voltage value and the minimum voltage value of the received modulation signal.

Accordingly, the electromagnetic wave transmission apparatus 20 of the present embodiment causes the electromagnetic wave reception apparatus 30 to recognize the maximum voltage value and the minimum voltage value of the modulation signal.

As shown in FIG. 4, the partial $V_{sync1}$ corresponding to the synchronization signal data, that is, the pattern of the synchronization signal, is set to a specific pattern (a pattern in which the voltage value transitions in an order of description $V_1$, $V_2$, $V_3$, and $V_4$, or a pattern in which the voltage value transitions in a reverse order of description) in which the voltage value transitions from one of the minimum voltage value (voltage value $V_1$) and the maximum voltage value (voltage value $V_4$) in the oscillation region RA to the other.

Therefore, the electromagnetic wave transmission apparatus 20 of the present embodiment can transmit a synchronization signal that is easily recognized by the electromagnetic wave reception apparatus 30. Accordingly, the electromagnetic wave communication system 10 of the present embodiment has high communication stability in terms of recognizability of the synchronization signal.

As described above, the present invention has been described as an example of the present embodiment, but the present invention is not limited to the present embodiment. The technical scope of the present invention also includes, for example, the following aspects (modification examples).

For example, in the present embodiment, the voltage values of four levels in the oscillation region RA have been described as setting voltage levels. However, the setting voltage levels in the oscillation region RA may be three levels or more.

Further, in the present embodiment, the pattern of the synchronization signal has been described as $V_{sync1}$ in FIG. 4, but the pattern of the synchronization signal may be a pattern different from these.

This application claims priority on the basis of Japanese Application Japanese Patent Application No. 2019-001972 filed on Jan. 9, 2019, and incorporates all of its disclosures herein.

REFERENCE SIGNS LIST

10: electromagnetic wave communication system
20: electromagnetic wave transmission apparatus
22: acquisition unit
24: conversion unit (an example of modulation unit)
24A: multi-value level conversion unit
24B: synchronization signal level conversion unit
26A: switching unit
26B: selector
28: transmission unit
29A: multi-value level setting unit
29B: synchronization level setting unit
30: electromagnetic wave reception apparatus
RA: oscillation region
RB: non-oscillation region
RC: non-oscillation region
W: electromagnetic wave (an example of terahertz wave)

The invention claimed is:

1. An electromagnetic wave transmission apparatus for use in an electromagnetic wave communication system, the electromagnetic wave transmission apparatus comprising:
a transmitter comprising an oscillation element having voltage-current characteristics having a local maximum value and a local minimum value located on a higher voltage side than the local maximum value, the transmitter being configured to receive a modulation signal and transmit an electromagnetic wave indicating the modulation signal by oscillating the oscillation element based on the modulation signal;
a converter configured to acquire a digital signal to be transmitted from the transmitter and convert the digital signal into multi-value data using voltage values of three levels or more in an oscillation region which is a voltage that is region equal to or more than the voltage of the local maximum value and equal to or less than the voltage of the local minimum value of the oscillation element; and
a selector configured to acquire the multi-value data from the converter and output the multi-value data to the transmitter as the modulation signal.

2. The electromagnetic wave transmission apparatus according to claim 1, wherein the transmitter receives a synchronization signal as at least a part of the modulation signal and transmits the electromagnetic wave whose part indicates the synchronization signal.

3. The electromagnetic wave transmission apparatus according to claim 2, wherein the synchronization signal has a maximum value and a minimum value among the voltage values of three levels or more, and includes a pattern in which a voltage value transitions from one of the maximum value and the minimum value to another one of the maximum value and the minimum value.

4. The electromagnetic wave transmission apparatus according to claim 2, wherein the synchronization signal is a signal using voltage values of all levels of the modulation signal.

5. The electromagnetic wave transmission apparatus according to claim 1, wherein the electromagnetic wave is a terahertz wave.

6. An electromagnetic wave communication system comprising:
the electromagnetic wave transmission apparatus according to claim 1; and
an electromagnetic wave reception apparatus which receives the electromagnetic wave transmitted by the electromagnetic wave transmission apparatus and demodulates the electromagnetic wave into a digital signal.

* * * * *